United States Patent
Toprac

(12) 
(10) Patent No.: US 6,379,980 B1
(45) Date of Patent: Apr. 30, 2002

(54) METHOD AND APPARATUS FOR MONITORING MATERIAL REMOVAL TOOL PERFORMANCE USING ENDPOINT TIME REMOVAL RATE DETERMINATION

(75) Inventor: Anthony J. Toprac, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/625,587

(22) Filed: Jul. 26, 2000

(51) Int. Cl.$^7$ ............................................... H01L 21/00
(52) U.S. Cl. ............................ 438/8; 156/345; 216/59; 216/84; 438/9; 438/710; 438/745
(58) Field of Search ........................... 438/8, 9, 14, 710, 438/745; 216/59, 60, 84, 86; 156/345 LC, 345 MT

(56) References Cited

U.S. PATENT DOCUMENTS

| | | | |
|---|---|---|---|
| 5,232,537 A | * 8/1993 | Yachi | 438/9 X |
| 5,578,161 A | * 11/1996 | Aude | 438/9 |
| 5,620,556 A | * 4/1997 | Henck | 438/9 X |
| 5,705,435 A | * 1/1998 | Chen | 438/8 |

* cited by examiner

*Primary Examiner*—William A. Powell
(74) *Attorney, Agent, or Firm*—Williams, Morgan & Amerson, P.C.

(57) ABSTRACT

A method for monitoring the performance of a material removal tool includes providing a wafer having at least one process layer formed thereon; measuring the thickness of the process layer; removing at least a portion of the process layer in the material removal tool until an endpoint of the removal process is reached; determining a removal rate based on the measured thickness of the process layer and a duration of the removal process until the endpoint is reached; and comparing the determined removal rate to an expected removal rate to monitor the performance of the material removal tool. A processing line includes a metrology tool, a material removal tool, and a process controller. The metrology tool is adapted to measure a thickness of a process layer formed on a wafer. The material removal tool is adapted to remove at least a portion of the process layer until an endpoint is reached. The process controller is adapted to determine a removal rate based on the measured thickness of the process layer and a duration of the removal process until the endpoint is reached and compare the determined removal rate to an expected removal rate to monitor the performance of the material removal tool.

37 Claims, 2 Drawing Sheets

METHOD AND APPARATUS FOR MONITORING MATERIAL REMOVAL TOOL PERFORMANCE USING ENDPOINT TIME REMOVAL RATE DETERMINATION

BACKGROUND OF THE INVENTION

1. Field of the Invention

This invention relates generally to the field of semiconductor device manufacturing and, more particularly, to a method and apparatus for monitoring material removal tool performance using endpoint time removal rate determination.

2. Description of the Related art

There is a constant drive within the semiconductor industry to increase the quality, reliability and throughput of integrated circuit devices, e.g., microprocessors, memory devices, and the like. This drive is fueled by consumer demands for higher quality computers and electronic devices that operate more reliably. These demands have resulted in a continual improvement in the manufacture of semiconductor devices, e.g., transistors, as well as in the manufacture of integrated circuit devices incorporating such transistors. Additionally, reducing the defects in the manufacture of the components of a typical transistor also lowers the overall cost per transistor as well as the cost of integrated circuit devices incorporating such transistors.

The technologies underlying semiconductor processing tools have attracted increased attention over the last several years, resulting in substantial refinements. However, despite the advances made in this area, many of the processing tools that are currently commercially available suffer certain deficiencies. In particular, such tools often lack advanced process data monitoring capabilities, such as the ability to provide historical parametric data in a user-friendly format, as well as event logging, real-time graphical display of both current processing parameters and the processing parameters of the entire run, and remote, i.e., local site and worldwide, monitoring. These deficiencies can engender nonoptimal control of critical processing parameters, such as throughput, accuracy, stability and repeatability, processing temperatures, mechanical tool parameters, and the like. This variability manifests itself as within-run disparities, run-to-run disparities and tool-to-tool disparities that can propagate into deviations in product quality and performance, whereas an ideal monitoring and diagnostics system for such tools would provide a means of monitoring this variability, as well as providing means for optimizing control of critical parameters.

One important aspect in semiconductor device manufacturing is the control of material removal processes, such as etching and polishing. Generally, most features on a semiconductor device are formed by depositing layers of material (e.g., conductive or insulative) and patterning the layers using photolithography and etch processes. Polishing processes are employed to planarize surfaces between various material depositing, steps. There are many variables that affect the accuracy and repeatability of the material removal processes used to form the features. One particular type of material removal tool uses a plasma etch process to perform a primarily anisotropic etch to form features on a semiconductor wafer. Certain etch recipes involve controlling the duration of the etch using a predetermined time. For such a timed etch to be robust, the etch rate of the tool must be predictable and repeatable. Other etch recipes proceed with the etch until an endpoint determination is made. Various techniques are available for detecting etch endpoints. For example, during a plasma etch process the plasma chemistry noticeably changes when a top layer is etched through and the tool begins to etch the underlying layer. The chemistry of the etch chamber is monitored, using for instance an optical emission spectrometer, and the etch is terminated when the change in chemistry is detected. Some etching processes involve the use of both a times etch process to remove the bulk of the material and an endpoint determination process to determine when processing is complete.

It is also common to determine endpoint times for polishing operations. Commonly used endpoint time detection techniques include monitoring motor parameters on the polishing tool, vibration, and characteristics of the wafers being polished. For example, the torque on the polishing motor may increase or decrease when an underlying layer is reached.

As technology improvements facilitate smaller critical dimensions for semiconductor devices, the need for reduction of errors increases dramatically. Proper formation of subsections within a semiconductor device is an important factor in ensuring proper performance of the manufactured semiconductor device. Critical dimensions of the subsections generally have to be within a predetermined acceptable margin of error for semiconductor devices to be within acceptable manufacturing quality.

The present invention is directed to overcoming, or at least reducing the effects of, one or more of the problems set forth above.

SUMMARY OF THE INVENTION

One aspect of the present invention is seen in a method for monitoring the performance of a material removal tool. The method includes providing a wafer having at least one process layer formed thereon; measuring the thickness of the process layer; removing at least a portion of the process layer in the material removal tool until an endpoint of the removal process is reached; determining a removal rate based on the measured thickness of the process layer and a duration of the removal process until the endpoint is reached; and comparing the determined removal rate to an expected removal rate to monitor the performance of the material removal tool.

Another aspect of the present invention is seen in a processing line including a metrology tool, a material removal tool, and a process controller. The metrology tool is adapted to measure a thickness of a process layer formed on a wafer. The material removal tool is adapted to remove at least a portion of the process layer until an endpoint time is reached. The process controller is adapted to determine a removal rate based on the measured thickness of the process layer and a duration of the removal process until the endpoint is reached and compare the determined removal rate to an expected removal rate to monitor the performance of the material removal tool.

BRIEF DESCRIPTION OF THE DRAWINGS

The invention may be understood by reference to the following description taken in conjunction with the accompanying drawings, in which like reference numerals identify like elements, and in which.

Figure 1:
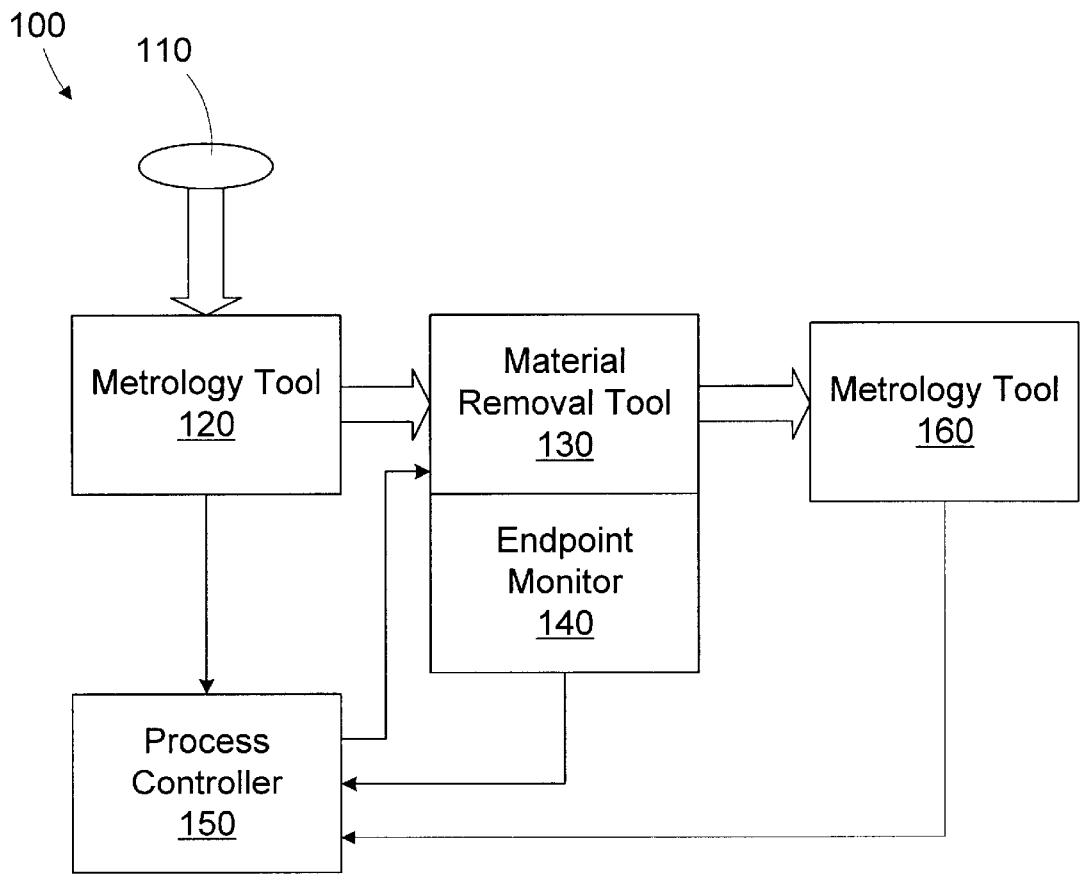
FIG. 1 is a simplified block diagram of a processing line in accordance with one illustrative embodiment of the present invention.
Figure 2:
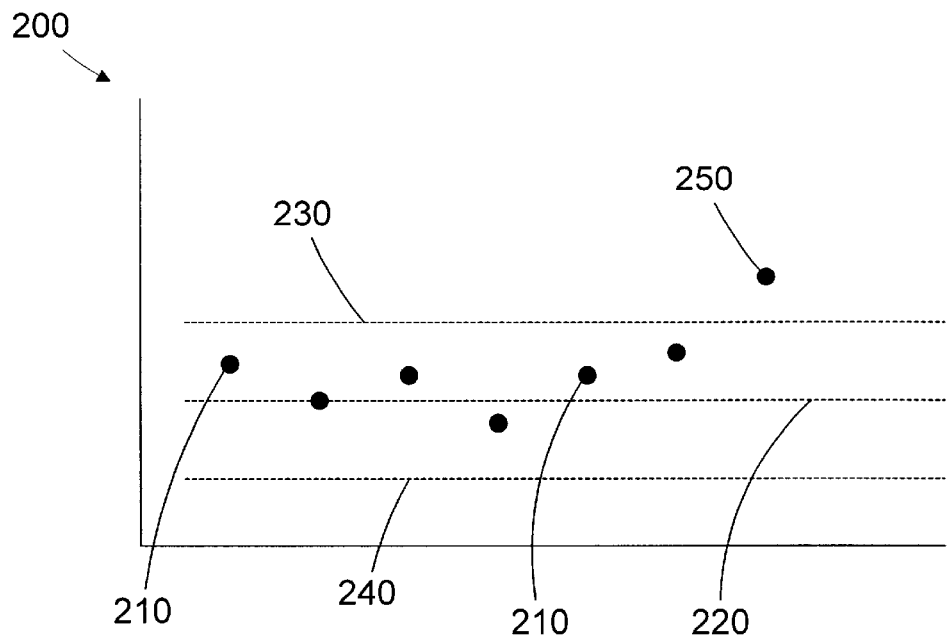
FIG. 2 is a control chart illustrating a first control technique for monitoring the performance of a material removal tool in the processing line of FIG. 1.

While the invention is susceptible to various modifications and alternative forms, specific embodiments thereof have been shown by way of example in the drawings and are herein described in detail. It should be understood, however, that the description herein of specific embodiments is not intended to limit the invention to the particular form-s disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Referring now to FIG. 1, a simplified diagram of a portion of an illustrative processing line 100 for processing wafers 110 in accordance with the present invention is provided. The processing line 100 includes a metrology tool 120, and a material removal tool 130. The material removal tool 130 includes an endpoint monitor 140 for determining the point at which a material removal process is to be terminated. Commonly used techniques for determining material removal endpoints are well known to those of ordinary skill in the art, and for clarity and ease of illustration, they are not described in greater detail herein. For example, the endpoint monitor 140 may be a Propak Optical Endpoint Spectrometer furnished by Peak Systems of Albuquerque, N.Mex. The endpoint monitor 140 outputs the time elapsed from the beginning of the removal process until the endpoint is reached (i.e., the total removal time). As may be applied herein, the term material removal tool 130 comprises any material removal tool (e.g., a tool for performing wet or dry etches, a plasma etch tool, a CMP tool) that uses an endpoint monitor 140 to determine a stopping point for the material removal process.

In some embodiments, where not all of the process layer is removed, the endpoint monitor 140 may also provide a measurement of the remaining thickness of the process layer by providing the time of the etch in the form of the endpoint time. For example, given known values for the etch rate of the process layer in question and the incoming thickness of this layer (from pre-etch metrology), the remaining thickness can be calculated as the incoming thickness minus the etch rate times the endpoint time for each wafer or lot of wafers processed. Values for the etch rate may be obtained by off-line characterization studies. In one optional embodiment, this known value of etch rate can be updated by post-process measurement, on a periodic basis, of removed film thickness divided by the endpoint time for wafer(s) measured. A separate metrology tool 160 may be used to provide this post-removal thickness measurement. The second metrology tool 160 is optional depending on the specific removal process and endpoint determination process.

A process controller 150 is provided for monitoring the performance of the material removal tool 130. The process controller 150 receives data from the metrology tool 120 and the endpoint monitor 140 (i.e., and the second metrology tool 160, if used) and determines the removal rate of the material removal tool 130 as a performance measure. The process controller 150 may also adjust the operating recipe of the material removal tool 130 to control the removal rate.

An exemplary tool suitable for performing the functions of the material removal tool 130 is a Centura 5300 model high density plasma etch tool offered by Applied Materials, or an Auriga model silicon oxide polishing tool offered by Speedfam. In the illustrated embodiment, the metrology tools 120, 160 are thickness measurement tools, such as Optiprobe tools offered by Thermawave, Inc. An exemplary tool suitable for performing the functions of the endpoint monitor 140 is the ProPak Optical Endpoint Spectrometer offered by Peak Systems.

In addition to monitoring the performance of the material removal tool 130, the process controller 150 may also adjust or control the operating recipe of the material removal tool 130 to try to achieve a removal rate closer to the target removal rate. Parameters that may be modified in the operating recipe include pressure, temperature, plasma power, etc., for a plasma etch tool, and polishing speed, polishing slurry chemistry, downforce, etc., for a polishing tool. Manipulation of these parameters may be conducted using an equation based model for determining a new operating recipe. Alternatively, a more complicated, predictive modeling technique, such as a neural network model, a principal component analysis (PCA) model, or a projection to latent structures (PLS) model, may be implemented. The specific implementation of the model may vary depending on the modeling technique selected, and such specific implementation is well known to those of ordinary skill in the art. Adapting the recipe to achieve a target removal rate across multiple material removal tools 130 in the manufacturing facility helps reduce tool-to-tool variation. More consistent results may be obtained if the various tools are operating under similar conditions.

In changing the recipe of the material removal tool 130, the process controller 150 may change a parameter or parameters within a baseline recipe or, alternatively, the process controller 150 may provide an entirely new recipe. The process controller 150 may update the recipe on a wafer-to-wafer basis, a lot-to-lot basis, or for each group of lots simultaneously processed in a single load.

Figure 3:
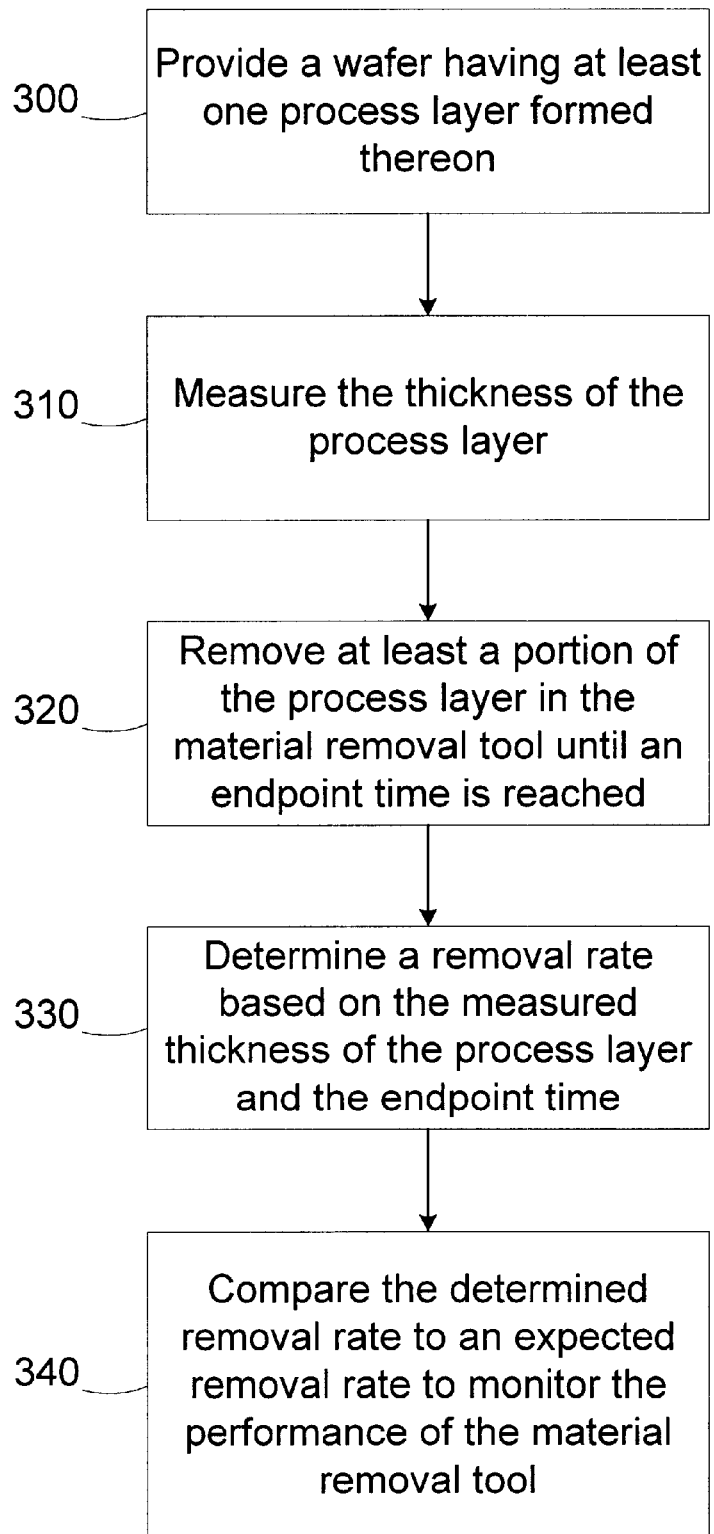
FIG. 3 is a simplified flow diagram of a method for monitoring the performance of a material removal tool using, endpoint time removal rate determination in accordance with another illustrative embodiment of the present invention.

Referring now to FIG. 3, a simplified flow diagram of a method for monitoring the performance of a material removal tool 130 using endpoint time removal rate determination in accordance with another illustrative embodiment of the present invention is provided. In block 300, a wafer having at least one process layer formed thereon is provided. In block 310, the thickness of the process layer is measured. In block 320, at least a portion of the process layer is removed in a removal tool 130 until an endpoint time is reached. In block 330, a removal rate is determined based on the measured thickness of the process layer and the endpoint time. In block 340, the removal rate so determined is compared to an expected removal rate to monitor the performance of the material removal tool 130. Monitoring the performance may include control charting the removal rates and/or using a predictive modeling technique to predict the expected removal rate. In response to determining a deviation from the expected removal rate, various actions may be taken. These actions may include signaling the deviation to an operator of the material removal tool 130, logging the material removal tool 130 out of service, recommending a preventative maintenance procedure or other corrective action, or adjusting the operating recipe of the material removal tool 130.

Monitoring the performance of the material removal tool 130, as described above, may reduce variations in the removal process and lead to more prompt and effective corrective actions, thus giving rise to a more stable, repeatable process. The throughput of the processing line 100 and the quality of the end product may be increased. Increased throughput and reduced variation lead directly to increased profitability.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for monitoring the performance of a material removal tool, comprising:
   providing a wafer having at least one process layer formed thereon;
   measuring the thickness of the process layer;
   removing at least a portion of the process layer in the material removal tool until an endpoint of the removal process is reached;
   determining a removal rate based on the measured thickness of the process layer and a duration of the removal process until the endpoint is reached; and
   comparing the determined removal rate to an expected removal rate to monitor the performance of the material removal tool.

2. The method of claim 1, further comprising initiating an automatic corrective action in response to identifying a deviation between the determined removal rate and the expected removal rate.

3. The method of claim 2, wherein initiating the automatic corrective action comprises sending an alert message to an operator of the material removal tool.

4. The method of claim 2, wherein initiating the automatic corrective action comprises logging the material removal tool out of service.

5. The method of claim 2, wherein initiating the automatic corrective action comprises adjusting the operating recipe of the material removal tool to reduce the deviation.

6. The method of claim 1, wherein comparing the determined removal rate to an expected removal rate comprises comparing the determined removal rate to at least one control limit and monitoring the performance of the material removal tool comprises identifying a degraded condition in response to the determined removal rate violating the control limit.

7. The method of claim 1, wherein comparing the determined removal rate to an expected removal rate comprises comparing the determined removal rate to an upper control limit and a lower control limit and monitoring the performance of the material removal tool comprises identifying a degraded condition in response to the determined removal rate violating at least one of the upper and lower control limits.

8. The method of claim 1, wherein comparing the determined removal rate to an expected removal rate comprises generating a predicted removal rate using a model of the material removal tool performance.

9. The method of claim 1, wherein removing at least a portion of the process layer in the material removal tool until an endpoint of the removal process is reached comprises removing the process layer until an endpoint associated with complete removal of the process layer is reached.

10. The method of claim 1, further comprising measuring a remaining thickness of the process layer, wherein determining the removal rate comprises determining the removal rate based on the measured thickness of the process layer, the measured remaining thickness of the process layer, and the duration of the removal process until the endpoint is reached.

11. A method for monitoring the performance of a material removal tool adapted to remove at least a portion of a process layer formed on a wafer, comprising:
   storing measured thicknesses of the process layers for a plurality of the wafers;
   storing endpoint times for the plurality of wafers processed in the material removal tool;
   determining removal rates based on the measured thicknesses and the endpoint times; and
   comparing the determined removal rates to an expected removal rate to monitor the performance of the material removal tool.

12. The method of claim 11, further comprising initiating an automatic corrective action in response to identifying a deviation between the determined removal rate and the expected removal rate.

13. The method of claim 12, wherein initiating the automatic corrective action comprises sending an alert message to an operator of the material removal tool.

14. The method of claim 12, wherein initiating the automatic corrective action comprises logging the material removal tool out of service.

15. The method of claim 11, wherein comparing the determined removal rates to an expected removal rate comprises comparing the determined removal rates to at least one control limit and monitoring the performance of the material removal tool comprises identifying a degraded condition in response to at least one of the determined removal rates violating the control limit.

16. The method of claim 11, wherein comparing the determined removal rates to an expected removal rate comprises comparing the determined removal rates to an upper control limit and a lower control limit and monitoring the performance of the material removal tool comprises identifying a degraded condition in response to at least one of the determined removal rates violating at least one of the upper and lower control limits.

17. The method of claim 11, wherein comparing the determined removal rate to an expected removal rate comprises generating a predicted removal rate using a model of the material removal tool performance.

18. The method of claim 11, wherein storing measured thicknesses of the process layers for a plurality of the wafers includes storing measured remaining thicknesses of the process layer for the plurality of wafers processed in the material removal tool.

19. A processing line, comprising:

a metrology tool adapted to measure a thickness of a process layer formed on a wafer;

a material removal tool adapted to remove at least a portion of the process layer until an endpoint is reached; and a process controller adapted to determine a removal rate based on the measured thickness of the process layer and a duration of the removal process until the endpoint is reached and compare the determined removal rate to an expected removal rate to monitor the performance of the material removal tool.

20. The processing line of claim 19, wherein the process controller is further adapted to initiate an automatic corrective action in response to identifying a deviation between the determined removal rate and the expected removal rate.

21. The processing line of claim 20, wherein the process controller is further adapted to send an alert message to an operator of the material removal tool.

22. The processing line of claim 20, wherein the process controller is further adapted to log the material removal tool out of service.

23. The processing line of claim 20, wherein the process controller is further adapted to adjusting the operating recipe of the material removal tool to reduce the deviation.

24. The processing line of claim 20, wherein the process controller is further adapted to compare the determined removal rate to at least one control limit and identify a degraded condition in response to the determined removal rate violating the control limit.

25. The processing line of claim 19, wherein the process controller is further adapted to compare the determined removal rate to an upper control limit and a lower control limit and identify a degraded condition in response to the determined removal rate violating at least one of the upper and lower control limits.

26. The processing line of claim 19, wherein the process controller is further adapted to generate a predicted removal rate using a model of the material removal tool performance.

27. The processing line of claim 19, wherein the endpoint times are associated with complete removal of the process layer.

28. The processing line of claim 19, further comprising a second metrology tool adapted to measure a remaining thickness of the process layer, wherein the process controller is adapted to determine the removal rate based on the measured thickness of the process layer, the measured remaining thickness of the process layer, and the duration of the removal process until the endpoint is reached.

29. A processing line, comprising:

means for measuring the thickness of a process layer formed on a wafer;

means for removing at least a portion of the process layer until an endpoint time is reached;

means for determining a removal rate based on the measured thickness of the process layer and the endpoint time; and means for comparing the determined removal rate to an expected removal rate to monitor the performance of a material removal tool.

30. A method for monitoring the performance of a material removal tool, comprising:

providing a wafer having at least one process layer formed thereon;

measuring the thickness of the process layer;

removing at least a portion of the process layer in the material removal tool until an endpoint of the removal process is reached;

measuring the thickness of a remaining portion of the process layer;

determining a removal rate based on the measured thickness of the process layer, the measured thickness of the remaining portion, and a duration of the removal process until the endpoint is reached; and comparing the determined removal rate to an expected removal rate to monitor the performance of the material removal tool.

31. The method of claim 30, further comprising initiating an automatic corrective action in response to identifying a deviation between the determined removal rate and the expected removal rate.

32. The method of claim 31, wherein initiating the automatic corrective action comprises sending an alert message to an operator of the material removal tool.

33. The method of claim 31, wherein initiating the automatic corrective action comprises logging the material removal tool out of service.

34. The method of claim 31, wherein initiating the automatic corrective action comprises adjusting the operating recipe of the material removal tool to reduce the deviation.

35. The method of claim 30, wherein comparing the determined removal rate to an expected removal rate comprises comparing the determined removal rate to at least one control limit and monitoring the performance of the material removal tool comprises identifying a degraded condition in response to the determined removal rate violating the control limit.

36. The method of claim 30, wherein comparing the determined removal rate to an expected removal rate comprises comparing the determined removal rate to an upper control limit and a lower control limit and monitoring the performance of the material removal tool comprises identifying a degraded condition in response to the determined removal rate violating at least one of the upper and lower control limits.

37. The method of claim 30, wherein comparing the determined removal rate to an expected removal rate comprises generating a predicted removal rate using a model of the material removal tool performance.

\* \* \* \* \*